United States Patent [19]

McGee

[11] Patent Number: 5,067,122
[45] Date of Patent: Nov. 19, 1991

[54] METHOD OF DETERMINING THE MONITOR SENSITIVITY OF, AND METHOD AND SYSTEM FOR CONTROLLING A RADIATION EMITTING ARRANGEMENT, AND OPTICAL RECORDING AND/OR REPRODUCING APPARATUS INCLUDING SUCH A SYSTEM

[75] Inventor: Philip J. L. McGee, Eindhoven, Netherlands

[73] Assignee: U.S. Philips Corporation, New York, N.Y.

[21] Appl. No.: 482,375

[22] Filed: Feb. 16, 1990

[30] Foreign Application Priority Data

Feb. 27, 1989 [GB] United Kingdom ............... 8904406

[51] Int. Cl.$^5$ .......................... G11B 7/00; G11B 7/85
[52] U.S. Cl. ..................... 369/116; 369/100; 369/122; 369/106
[58] Field of Search .................. 369/106, 116, 122

[56] References Cited

U.S. PATENT DOCUMENTS 4,785,443 11/1988 Minami et al. ..................... 369/116

Primary Examiner—Roy N. Envall, Jr.
Assistant Examiner—Nabil Hindi
Attorney, Agent, or Firm—Leroy Eason

[57] ABSTRACT

A method is described which enables automatic determination of the monitor sensitivity of a radiation emitting arrangement (in particular a laser diode and photodiode arrangement), which monitor sensitivity relates a level of a monitor signal ($I_M$) generated by the arrangement to a corresponding optical output level ($O_L$) of the arrangement. The method comprises the steps of: (i) supplying a varying drive signal ($I_{L1}, I_{L2}$) to the arrangement and measuring the rate of change ($\Delta I_M/\Delta I_L$) of the monitor signal ($I_M$) with respect to the supplied drive signal ($I_L$); and (ii) combining the measured rate of change with an assumed differential efficiency (k) of the arrangement to determine the monitor sensitivity ($O_L/I_M$) of the arrangement. The provision of a control system able to implement such a method eliminates the need for a factory adjustment in the manufacture of apparatus such as optical recording and/or reproducing apparatus.

17 Claims, 3 Drawing Sheets $$O_L = (I_L - I_{L0})k \quad \cdots \cdots (1)$$

$$\frac{O_L}{I_m} = \frac{\Delta O_L}{\Delta I_m} \quad \cdots \cdots (2)$$

$$= \frac{\Delta(I_L - I_{L0})k}{\Delta I_m} = \frac{\Delta I_L}{\Delta I_m}k \quad \cdots \cdots (3)$$

METHOD OF DETERMINING THE MONITOR SENSITIVITY OF, AND METHOD AND SYSTEM FOR CONTROLLING A RADIATION EMITTING ARRANGEMENT, AND OPTICAL RECORDING AND/OR REPRODUCING APPARATUS INCLUDING SUCH A SYSTEM

BACKGROUND OF THE INVENTION

The invention relates to a method of determining the monitor sensitivity of a radiation emitting arrangement, which monitor sensitivity relates a level of a minitor signal generated by the arrangement to a corresponding optical output level of the arrangement.

The invention more particularly, relates to a method of controlling a radiation emitting arrangement, the method comprising the steps of receiving a monitor signal from the arrangement and supplying a drive signal to the arrangement at such a level that a level of the monitor signal corresponds to a monitor reference level representing a desired optical output level of the arrangement.

The invention relates even more particular, to a system for controlling a radiation emitting arrangement, the system comprising means for receiving a monitor signal from the arrangement and drive means for supplying a drive signal to the arrangement at such a level that a level of the monitor signal corresponds to a monitor reference level representing a desired optical output level of the arrangement.

An important application of radiation emitting arrangements, and consequently for methods and systems as set forth above, is in optical recording and/or reproducing apparatuses such as the well-known Compact Disc (CD) players.

The invention still further relates to an optical recording and/or reproducing apparatus comprising a radiation emitting arrangement and a control system for supplying a drive signal to the arrangement in response to a monitor signal received from the arrangement. Those skilled in the art will readily appreciate that the invention is also of use in other applications, for example in optical communications.

A control system such as set forth above for use in an optical disc recording and reproducing apparatus is disclosed in European Patent Application EP-A2-0223576 to which U.S. Pat. No. 4,785,443 corresponds. In optical disc reproducing apparatus, the radiation source is typically a semiconductor laser which emits a powerful beam of infrared radiation when supplied with a drive current above a threshold value. Because the threshold value of the drive current is highly variable, notably with temperature, a photodiode is mounted with the laser so that the optical output power of the laser can be monitored directly and controlled by feedback.

Unfortunately, the efficiency of the optical coupling between the laser and the photodiode is highly variable, due in particular to tolerances in the manufacture of the laser/photodiode assemblies, so that an initial adjustment of all new control systems must be made at the factory. For the example of a CD player, this is typically done by inserting a reference disc of known reflectivity and adjusting the monitor signal gain to achieve a desired output from a photodiode array in the optical pick-up. In the known system this adjustment is made by means of a variable resistance in series with the monitor photodiode.

It is well known that such an adjustment process represents a significant addition to the manufacturing cost of a CD player or other apparatus, particularly since the adjustment in question is in many CD players the only manual adjustment not to have been automated or eliminated by improved design.

The problem is exacerbated by the fact that when using low-cost laser/photodiode assemblies the control system must cope with such a wide range of variation in monitor sensitivity that even a slight misadjustment, for example during after-sales service, can easily destroy the laser.

SUMMARY OF THE INVENTION

It is an object of the invention to obtain a reduction of the manufacturing costs of equipment including radiation emitting arrangements of the type described.

The invention provides a method of determining the monitor sensitivity of a radiation emitting arrangement, which monitor sensitivity relates a level of a monitor signal generated by the arrangement to a corresponding optical output level of the arrangement, characterised in that the method comprises the steps of:

(i) supplying a varying drive signal to the arrangement and measuring the rate of change of the monitor signal with respect to the supplied drive signal; and (ii) combining the measured rate of change with an assumed differential efficiency of the arrangement to determine the monitor sensitivity of the arrangement. The differential efficiency of the arrangement is the rate of change of the optical output level with respect to the drive signal and, compared with the monitor sensitivity, is relatively well-defined. Therefore, the method in accordance with the invention, which is fully automatable, allows the monitor sensitivity of a radiation emitting arrangement to be measured without knowledge of the properties of the optical system being driven, and consequently without the need for testing with reference discs or equivalent measures to be performed on each completed apparatus.

The step (i) may comprise:

supplying a drive signal to the arrangement at a first drive level such that the monitor signal is at a first monitor reference level and measuring the said first drive level;

changing the level of the drive signal supplied to the arrangement to a second drive level such that the monitor signal is at a second monitor reference level and measuring the said second drive level; and dividing the difference between the first and second monitor levels by the difference between the first and second drive levels to find the said rate of change of the monitor signal with respect to the drive signal. This provides a simple embodiment of the method, although more than two reference levels could be used, or continuous variations could be applied to the drive signal.

The first and second monitor reference levels may be predetermined by reference to a defined monitor sensitivity so that the possibility of the optical output of the arrangement exceeding a predetermined maximum level during performance of the method is reduced. Provided that a "worst case" monitor sensitivity can be defined, the method can thus be performed without risk of damage to the arrangement.

The invention further provides a method of controlling a radiation emitting arrangement as set forth in the second opening paragraph, characterised in that the method further comprises as a preliminary step determining the monitor sensitivity by a method in accordance with the invention as set forth above.

The method may comprise the further step of modifying the monitor reference level, and hence the desired output level of the arrangement, in response to an output level of an optical system whose input is the optical output of the radiation emitting arrangement being controlled. This enables tolerances in the optical system to be compensated, which are not taken into account in the determination of the monitor sensitivity. The modification of the monitor reference level may be limited so as to prevent the optical output of the arrangement exceeding a predetermined maximum level.

In an illustrative embodiment of the method suitable for controlling a radiation emitting arrangement in an optical recording and/or reproducing apparatus, the output of the optical system may be an information signal received from an information carrier illuminated by the optical output of the arrangement being controlled. In a CD player, for example, the information signal is derived from the radiation reflected by the disc back into the optical pick-up of the player.

The invention still further provides a system as previously mentioned for controlling a radiation emitting arrangement, characterised in that the system further comprises means for measuring the rate of change of the monitor signal with respect to the drive signal and means for combining the measured rate of change with an assumed differential efficiency of the arrangement in order to determine the said monitor sensitivity.

The system may further comprise means for modifying the monitor reference level, and hence the desired optical output level of the arrangement, in response to an output level of an optical system whose input is the optical output of the radiation emitting arrangement being controlled. Such a control system may further comprise means for limiting the modification of the monitor reference level so as to prevent the optical output of the arrangement exceeding a predetermined maximum level.

In an illustrative embodiment of the control system suitable for use in an optical recording and/or reproducing apparatus, the said output of the optical system may be an information signal received from an information carrier illuminated by the optical output of the arrangement being controlled.

The rate of change measuring means may comprise means for supplying a first monitor reference level to the drive means so as to produce a drive signal at a first drive level, means for supplying a second monitor reference level to the drive means so as to produce a drive signal at a second drive level, means for measuring the said first and second drive levels and means for dividing the difference between the first and second monitor reference levels by the difference between the first and second drive levels to find the rate of change of the monitor signal with respect to the drive signal. The first and second monitor reference levels may be predetermined by reference to a defined monitor sensitivity so that the possibility of the optical output of the arrangement exceeding a predetermined maximum level during the measurement is reduced.

The system may include a digital control circuit having an output for setting the monitor reference level and having an input for receiving information representing the level of the drive signal being supplied to the arrangement. The digital control circuit may form part of a larger digital signal processing chip, or may comprise a suitably programmed microcontroller.

The invention still further provides an optical recording and/or reproducing apparatus comprising a radiation emitting arrangement and a control system for supplying a drive signal to the arrangement in response to a monitor signal received from the arrangement, characterised in that the control system comprises a system in accordance with the invention as set forth above.

The radiation emitting arrangement may comprise a laser element for producing laser radiation in response to the drive signal and a monitor element arranged to receive a minor part of the laser radiation and to produce a monitor signal at a level indicative of the intensity of the another part of the laser radiation.

The laser radiation may comprise a main, forward optical output beam and a weaker, backward optical output beam, the monitor element being arranged to receive the backward beam while the forward beam is supplied to an optical system of the apparatus.

The laser element may comprise a semiconductor laser diode and the monitor element may comprise a semiconductor photodetector. Such elements are available at low cost and are commonly used in such apparatus today.

BRIEF DESCRIPTION OF THE DRAWING

Illustrative embodiments of the invention will now be described, by way of example, with reference to the accompanying drawing, in which.

DETAILED DESCRIPTION OF THE PREFERRED EMBODIMENTS

Figure 1:
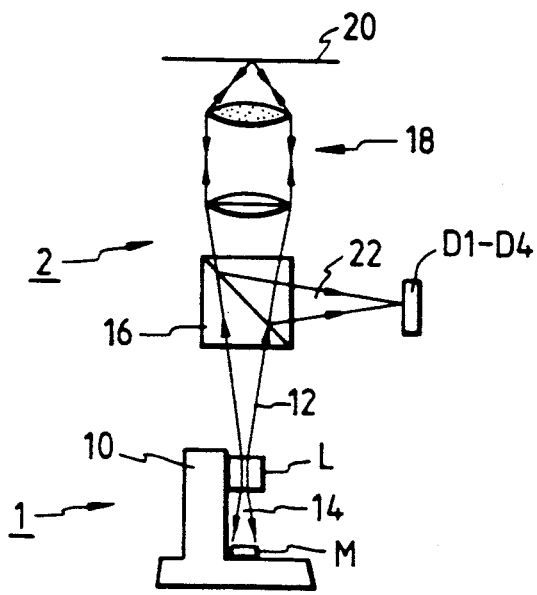
FIG. 1 is a schematic illustration of a radiation emitting arrangement driving the optical system of an optical disc player.

FIG. 1 shows schematically a typical example of a radiation emitting arrangement 1 and an optical system 2 which, for the purposes of this description only, is the pick-up of an optical disc player, such as a Compact Disc (CD) player.

The arrangement 1 comprises a radiation emitting device in the form of a semiconductor laser diode L and a monitor device in the form of a monitor photodiode M. The electrical circuit of the arrangement 1 can be seen in a dashed box in FIG. 2, to be described below. The devices L and M in this example are mounted together on a support 10 as shown. When supplied with an appropriate drive current $I_L$, the laser diode L produces two beams of infra-red radiation 12 and 14.

A main forward beam of radiation 12 leaves the arrangement 1 to become the input of the optical system 2. The beam 12 passes through a prism 16 and focussing system 18 by means of which it is focussed onto an information carrying surface within an optical memory disc (CD) 20. The beam 12 is then reflected back from the information surface through the focussing system 18 and into the prism 16, where it is diverted into a beam 22 which impinges on an array of four photodiodes D1-D4.

The reflected beam 22 carries information from the disc which can be demodulated and decoded to give useful information output. By using different combinations of the signals of the four photodiodes D1 to D4, it is also possible to derive information to enable focussing and tracking control in a manner described for example in Chapter 2 of "Principles of Optical Disc Systems", edited by G. Bouwhuis and published in 1985 by Adam Hilger, ISBN 0-85274-785-3.

The optical output level of the laser L cannot be accurately predicted merely from the value of the drive current $I_L$. Therefore, the monitor diode M is arranged to receive the second backward beam of radiation 14, which is proportional to, but weaker than the forward beam 12. Under reverse bias, the monitor diode M passes a monitor signal current $I_m$ which is proportional to the optical output level $O_L$ of the laser L, in this case, the intensity of the forward beam 12.

Figure 2:
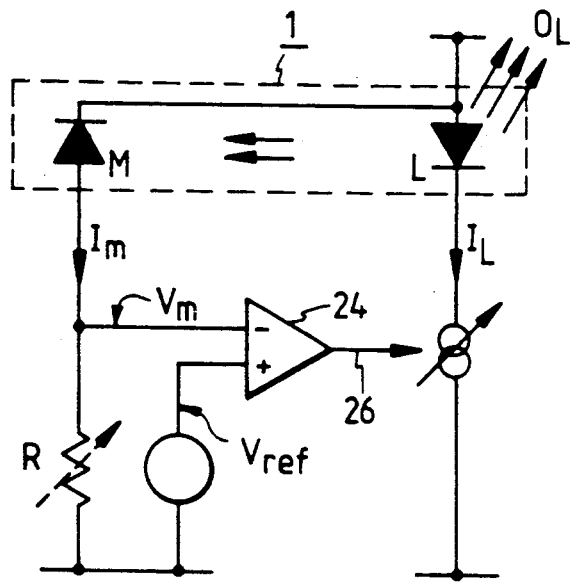
FIG. 2 shows in simplified form a known control system driving the radiation emitting arrangement of FIG. 1.

FIG. 2 shows how the monitor signal $I_m$ may be used by a feedback control system to control directly the optical output level of the laser. The control system includes a resistance R in the path of the monitor current $I_m$ so as to generate a proportional voltage $V_m$ at the inverting input (−) of a differential amplifier 24. The output 26 of the differential amplifier 24 controls a variable current source 28 which supplies a drive signal current $I_L$ to the laser diode L of the arrangement 1. A voltage ($V_L$) may be used as the drive signal if a resistor is used in series with the laser diode L. By supplying a monitor reference voltage $V_{ref}$ to the non-inverting (+) input of the differential amplifier 24, the drive current $I_L$ will be controlled by negative feedback so that the monitor signal $V_m = I_m R = V_{ref}$. Therefore, provided that the constant of proportionality $I_m/O_L$, which is the so-called monitor sensitivity, is known, the laser current $I_L$ can be controlled to give any desired optical output level $O_L$ within the specification of the laser diode.

Unfortunately, due mainly to variations in the position of the monitor diode M with respect to the highly directional beam 14, the monitor sensitivity is highly variable between different radiation emitting arrangements. This is illustrated in Table 1, which contains selected data from the manufacturer's data sheet for Sharp Corporation's LT022MS, a low-cost laser/-photodiode arrangement which is used in many CD players. In the case of the LT022MS, the monitor sensitivity can vary by as much as a factor of seven.

TABLE 1

| Data for LT022MS | | | | |
|---|---|---|---|---|
| Parameter | Min | Typ. | Max | Units |
| Maximum Optical Power output ($O_{Lmax}$) | — | 5 | — | mW |
| Laser threshold current ($I_{LO}$) | — | 45 | 70 | mA |
| Laser operating current ($I_L$, 3 mW) | — | 55 | 85 | mA |
| Laser differential efficiency (k) | 0.15 | 0.3 | 0.6 | mW/mA |
| Monitor Sensitivity ($I_m/O_L$) | 0.04 | 0.13 | 0.28 | mA/mW |

Therefore it has been necessary to perform an adjustment of the control system in each individual CD player or other apparatus to compensate for indeterminacy of the monitor sensitivity. In the manufacture of CD players, for example, this adjustment is commonly performed after assembly by inserting a reference disc of known reflectivity into the player (into the optical system 2 of FIG. 1). The actual output of the optical system, measured by the photodiode array D1-D4, can then be used for example to adjust the value of the resistance R (FIG. 2) to compensate for the monitor sensitivity variations and give a monitor signal voltage $V_m = I_m R$ which is then related by a known factor to the output of the optical system 2.

Such an adjustment process represents a considerable expense in the manufacture of any apparatus, and especially so in the case of a consumer product such as a CD player. Since there is also a high risk that in the course of the adjustment, the laser could inadvertently by driven significantly beyond its maximum output rating (5 mW for the LT022MS). If this happens, even for only a few nanoseconds, the laser will be destroyed. Furthermore, in a field service situation, with less experienced personnel, any mistake during readjustment can destroy the laser, with no guarantee that a replacement laser will not be destroyed in the same way.

Figure 3:
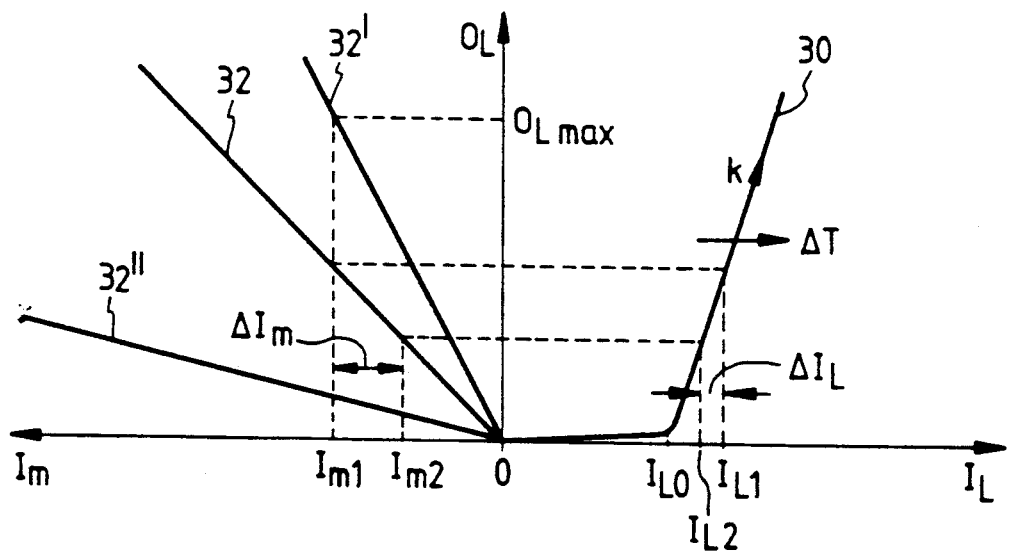
FIG. 3 depicts a graph and equations illustrating the principle of the present invention.

FIG. 3 includes a graph showing the optical output level $O_L$ (vertical axis) against the drive signal current $I_L$ (right quadrant) and the monitor signal current $I_m$ (left quadrant) for a radiation emitting arrangement such as the Sharp LT022MS. A first curve 30 shows the output level $O_L$ with respect to the drive current $I_L$. It can be seen that the output level $O_L$ is almost negligible until laser action commences at a threshold value $I_{LO}$ of the drive current $I_L$. Thereafter $O_L$ rises steeply with $I_L$, at a rate given by the slope of the curve 30, which is the so-called differential efficiency k of the arrangement. Therefore $O_L$ can be defined in terms of $I_{LO}$, $I_L$ and k as shown in Equation (1) in FIG. 3.

The threshold current $I_{LO}$ is highly variable between arrangements, as shown in Table 1, and moreover it is highly temperature dependent. The differential efficiency k of the laser on the other hand is substantially constant, for a given arrangement 1 so that, as the temperature of the laser increases, the curve 30 simply shifts in the direction shown by the arrow Δ T.

The line 32 in the left quadrant of the graph shows the output $O_L$ against the monitor signal current $I_m$ for a given emitting arrangement having an intermediate monitor sensitivity. The lines 32' and 32'' represent the minimum and maximum expected values of the monitor sensitivity respectively. The range of variation between the lines 32' and 32'' is too great to allow the required control of the laser without adjustment, so that a means of compensating for the actual monitor sensitivity (line 32) must be found.

In accordance with one embodiment of the invention, the arrangement is driven with drive current $I_L = I_{L1}$ such that the monitor current $I_m$ is at a first monitor reference level $I_{m1}$. From the graph of FIG. 3, it will be seen that this level $I_{m1}$ can be chosen using the minimum monitor sensitivity line 32' as a "worst case", so that $O_L$ will not exceed $O_{Lmax}$ (5 mW for the LT022MS) under any circumstances. With $I_m = I_{m1}$, the drive current $I_L = I_{L1}$ is measured and noted for future use. Next a second monitor reference level $I_{m2}$ is selected, also with regard to the worst case line 32' and the maximum output level $O_{Lmax}$. The resulting second drive current $I_L = I_{L2}$ is measured and noted, for use in determining the monitor sensitivity $I_m/O_L$.

Equation (2) shows that the reciprocal $O_L/I_m$ of the monitor sensitivity, which is equal to the slope of the line 32 in FIG. 3, is also equal to the ratio of any change $\Delta O_L$ to the resultant change $\Delta I_m$ in $I_m$. This follows since when $O_L=0$, $I_m=0$ also. Using Equations (1) and (2), Equation (3) shows how $\Delta O_L$ can be replaced by $k\Delta I_L$, which is the change in the drive current $I_L$ multiplied by the differential efficiency k of the laser.

Provided therefore that the differential efficiency k of the laser is known or can be assumed with an acceptable tolerance, the measured and noted values $I_{m1}$, $I_{m2}$, $I_2$, giving a value $\Delta I_L=I_{L1}-I_{L2}$ and a value $\Delta I_m=I_{m1}-I_{m2}$, can be used in Equation (3) to calculate the reciprocal of the monitor sensitivity $I_m/O_L$. It can be seen from Table 1 that k for the LT022MS does vary quite widely, though not as widely as the monitor sensitivity. However, it is found that in practice the differential efficiency k is constant to within a few per cent over very large batches of laser arrangements, whereas the monitor sensitivity may vary from arrangement to arrangement within each batch.

Figure 4:
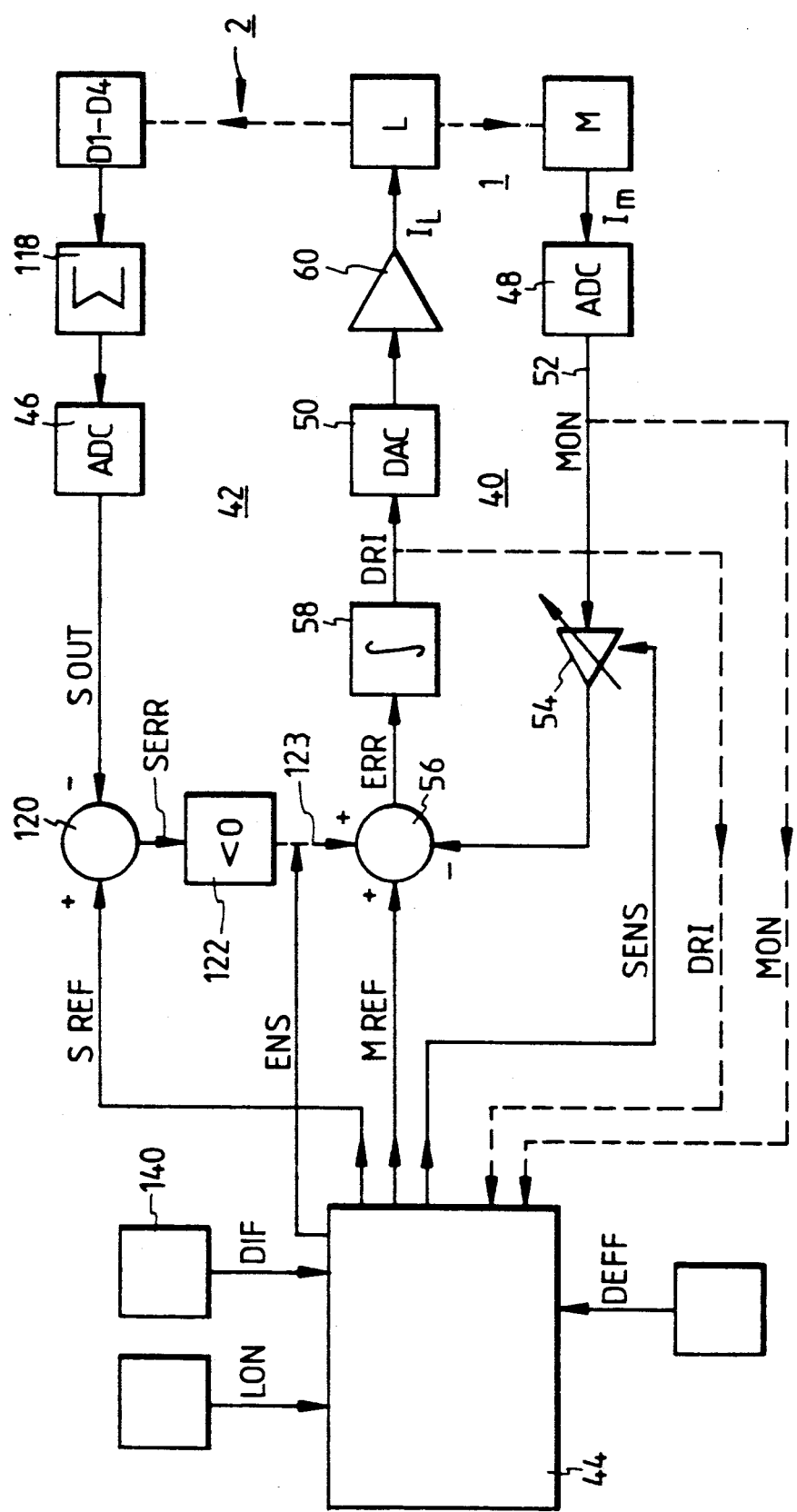
FIG. 4 is a block diagram of a control system in accordance with the present invention.

FIG. 4 is a schematic block diagram of a system for controlling a radiation emitting arrangement in accordance with the method just described, the arrangement forming, for the sake of example only, part of the optical pick-up of a CD player. The control system comprises two feedback loops—a monitor loop 40 and an apparatus loop 42—and a controller 44 which sets and monitors various parameters of the two feedback loops 40 and 42. In the embodiment shown, most of the signal processing is performed in the digital domain, with analogue-to-digital converters (ADC's) 46 and 48 and a digital-to-analogue converter (DAC) 50 provided at appropriate points. Those skilled in the art will readily appreciate that equivalent systems can be constructed in which digital processing is used to a greater or lesser extent, with the converters 46, 48, 50 at different positions as necessary. Which type of processing is used is entirely a matter of design and in the following description no further distinction will be made between digital and analogue signals.

The laser diode L and the monitor diode M form part of the monitor loop 40, which is broadly equivalent to the basic control system of FIG. 2. The purpose and operation of the apparatus loop 42, which includes the optical system 2 and the photodiodes D1 to D4, will not be described until after the description of the flow chart of FIG. 5.

A signal MON representative of the current $I_m$ through the monitor photodiode M is generated at 52 and is fed to the input of a variable scaling circuit 54. The scaling circuit 54 receives a monitor sensitivity signal SENS from the controller 44 and cancels the effect of monitor sensitivity variations between different arrangements by applying a corresponding scaling factor to the signal MON. The scaled signal MON is supplied to an inverting input of a summing circuit 56. The summing circuit 56 also has a non-inverting input which is supplied by the controller 44 with a monitor reference signal MREF, and has an output which generates an error signal ERR which represents the difference between the actual monitor signal MON (after scaling) and the monitor reference signal MREF.

In an alternative embodiment, the variable scaling circuit 54 and the output SENS of the controller 44 could be eliminated, if desired, by performing variable scaling of the monitor reference signal MREF within the controller 44. While that alternative would save a certain amount of hardware, however, it does have the side effect of making the feedback characteristics of the monitor loop dependent on the monitor sensitivity, resulting in an unpredictable bandwidth.

The error signal ERR is passed through an integrator 58 to generate a drive signal DRI which represents a drive current $I_L$ to be applied to the laser L. A drive amplifier 60 generates the required current $I_L$ to drive the laser diode L. The drive current $I_L$ may be generated directly by the amplifier 60, or the amplifier may supply a drive voltage $V_L$ to the laser L via a series resistor. The optical coupling between the laser diode L and the monitor diode M completes the monitor feedback loop 40.

In operation, the controller 44 has only to supply an appropriate monitor reference signal MREF to the summing circuit 56 for the monitor feedback loop 40 to ensure that a corresponding optical output level $O_L$ is produced by the laser L, provided that the signal SENS supplied to the scaling circuit 54 represents the correct monitor sensitivity $I_m/O_L$ for the emitting arrangement 1. In the known apparatus, this monitor sensitivity is determined as described above by manual adjustment. However, in the present system, this can be determined automatically by a suitably programmed controller 44, using the Equations (1) to (3) shown in FIG. 3.

To this end, the controller 44 has inputs for receiving the monitor signal MON and the drive signal DRI from the monitor loop 40, and also for receiving a value DEFF representing the differential efficiency k of the laser L being controlled. The controller 44 also has an input for receiving a binary signal LON indicating whether the laser should be on or off (LON=1 or 0).

Figure 5:
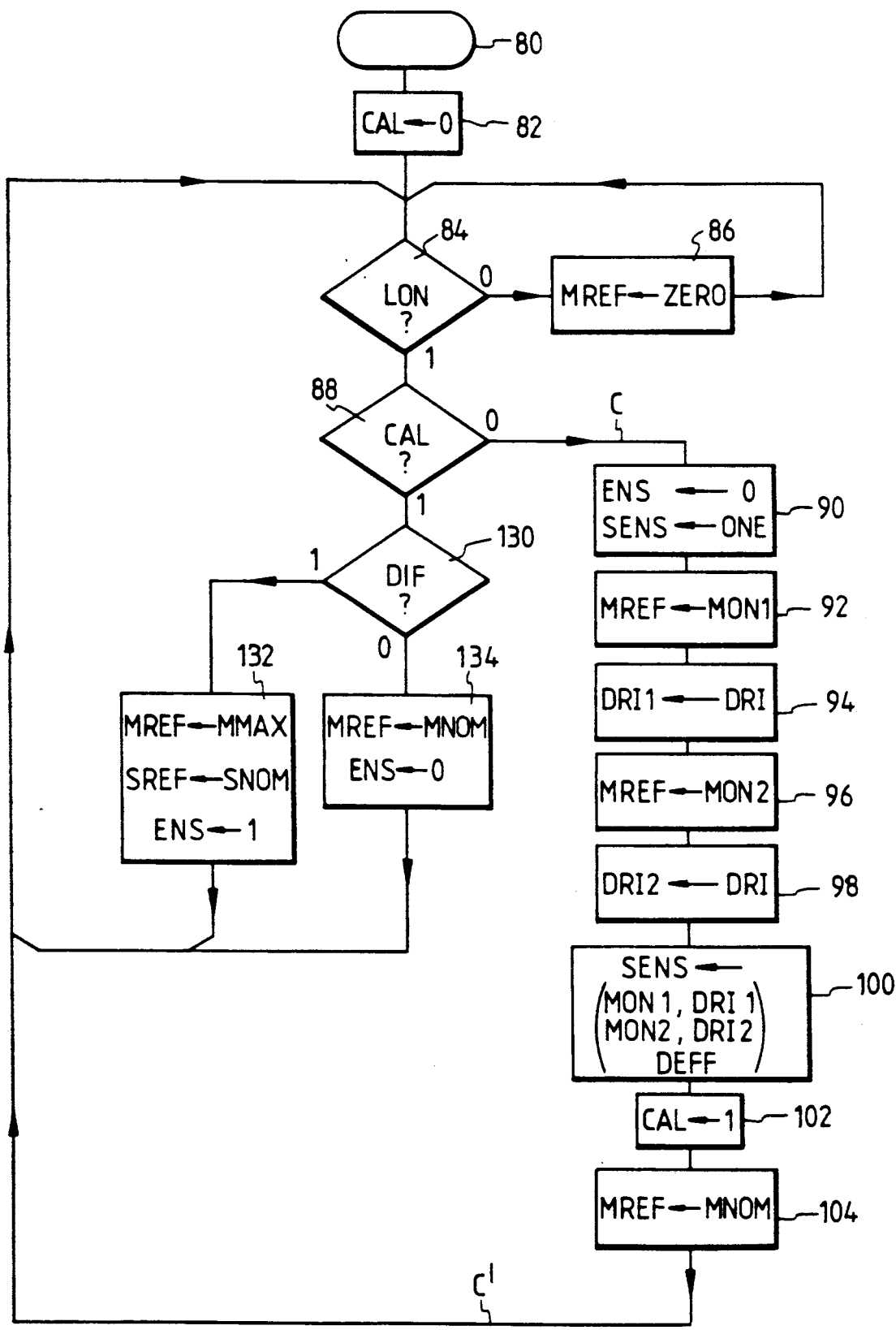
FIG. 5 is a flow chart illustrating the operation of the system of FIG. 3.

FIG. 5 is a flow chart showing how the controller 44 controls the operation of the arrangement 1 via the monitor feedback loop 40 and the apparatus loop 42 to be described below and, as a preliminary step, determines the monitor sensitivity $I_m/O_L$ of the arrangement 1 to which it is connected.

The flow chart starts (step 80) when power is first applied to the CD-player. Since in this embodiment the monitor sensitivity is not stored when the power is not applied, a flag CAL in the controller 44 is reset (step 82) to indicate that the monitor sensitivity of the arrangement 1 is as yet undetermined.

In step 84 the input signal LON is tested to see whether the laser should be on or off. If LON=0 (laser off) the controller 44 outputs a monitor reference signal MREF=ZERO (step 86) so as to cause the monitor feedback loop 40 to supply no drive current to the laser L ($I_L=0$). This situation is maintained by means of a loop back to the step 84 until the input signal LON changes to a '1'.

When LON=1, the laser must be energized. However it is first necessary to check whether or not the monitor sensitivity has been determined yet. This is done in step 88 by testing the flag CAL. Assuming that the flag CAL remains reset, a calibration routine CC' is performed in order to determine the monitor sensitivity $I_m/O_L$, represented in this embodiment by the value SENS.

The calibration routine CC' begins in step 90 by generating an output signal ENS=0 which disables the apparatus loop during the performance of the calibration routine. Also in step 90, the monitor sensitivity value SENS is provisionally set to ONE, a known value which causes the gain of the scaling circuit 54 to be unity. Therefore, by virtue of the feedback action around the monitor loop 40, the actual monitor signal MON, and hence the laser output level $O_L$, will be regulated in accordance with any monitor reference signal MREF generated by the controller 44.

Step 92 sets MREF to a first monitor reference level MON1, which effects the setting of $I_m = I_{m1}$ as described earlier with reference to FIG. 3. At this point, the drive current $I_L$ produced by the amplifier 60 is at the first drive level $I_{L1}$ (see FIG. 3). In step 94 the drive signal DRI which represents the first drive level $I_{L1}$ is stored within the control circuit 44 as a value DRI1. As described earlier, the first monitor reference level MON1 can be chosen so that even in a worst case situation the maximum optical output $O_{Lmax}$ for the laser is not exceeded.

In step 96 a second monitor reference level MON2 is output so that $I_m = I_{m2}$ and consequently $I_L = I_{L2}$ (see FIG. 3). In step 98, the signal DRI, representing the second drive level $I_{L2}$ is stored as a value DRI2 in the controller 44. In step 100, the monitor sensitivity $I_m/O_L$ is calculated using the values MON1, DRI1, MON2, DRI2 and the assumed differential efficiency value DEFF in accordance with the Equations (1) to (3) (FIG. 3).

The monitor sensitivity having been determined, the controller 44 then changes the value SENS to adjust the scaling factor of the scaling circuit 54 so as to compensate for the actual monitor sensitivity of the arrangement 1. Thereafter, the monitor reference signal MREF can be relied upon to correspond in a known manner to the actual optical output power $O_L$ of the laser L. To indicate this fact, in step 102 the controller 44 sets the flag CAL which will remain set until the CD-player is disconnected from its power supply. The calibration routine CC' ends with step 104 wherein MREF is set to a value MNOM representing a desired nominal optical output power $O_L$, for example 3 mW for the LT022MS. The controller 44 then returns to step 84.

It will be appreciated by those skilled in the art that the automatic calibration routine CC' performed at power-up has eliminated the need for a factory measurement of the monitor sensitivity, thereby affording a considerable saving in the manufacturing cost of the CD player. However, the automatic monitor sensitivity compensation differs in effect from the known strategy in an important respect. The automatic strategy implemented by the monitor loop 40 only enables a known optical power $O_L$ to be achieved at the output of the radiation emitting arrangement 1. In contrast, the known method makes use of the output of the complete optical system, as measured by the photodiodes D1 to D4 (FIG.1), and is therefore able to compensate to a limited extent for tolerances in the optical system, as well as for variations in the monitor sensitivity. In other words, setting an optimum laser output $O_L$ by means of the automatic method, as described so far, may lead to a non-optimum level at the output of the optical system. This disadvantage is reduced in the control system of FIG. 4 by the operation of the apparatus feedback loop 42.

Returning then to FIG. 4, in the apparatus feedback loop 42, a summing circuit 118 and the ADC 46 generate a signal SOUT representing the total radiation received by the photodiodes D1 to D4, that is to say the output of the optical system 2 whose input is the optical output of the arrangement 1. This signal SOUT is supplied to an inverting input of a further summing circuit 120. An apparatus loop reference signal SREF is supplied by the controller 44 to a non-inverting input of the further summing circuit 120. The output of the circuit 120 thus carries an error signal SERR which represents the difference between a desired optical system output level and the actual optical system output level represented by SREF and SOUT respectively.

The error signal SERR is supplied to a limiting circuit 122 which permits only zero or negative values of SERR to pass. The limited SERR values from the limiting circuit 122 are supplied via the dashed connection 123, to a further non-inverting input of the first-mentioned summing circuit 56, subject to a signal ENS = 1 being generated by the controller 44. The remainder of the apparatus feedback loop 42 is thus common to the monitor loop 40 described above. At the summing circuit 56, the apparatus loop error signal SERR effectively modifies the monitor reference level, and therefore also the optical output of the arrangement 1, in response to the output of the optical system 2, which includes the pick-up and the optical disc (CD). If the signal ENS = 0 is generated, the connection 123 is not made and the apparatus loop 42 has no effect.

The flow chart of FIG. 5 shows how the apparatus loop 42 can be used in the control system of FIG. 4 to achieve an optimum output of the optical system 2. Assuming that in steps 84 and 88 it is determined that the laser should be on (LON = 1) and that the monitor sensitivity has already been determined (CAL = 1), then control passes to a step 130 in which a binary signal DIF is tested to determine whether the apparatus feedback loop should be enabled (ENS = 1) or disabled (ENS = 0). The signal DIF may for example be derived from a "disc-in-focus" signal supplied by a servo circuit 140 of the CD player, so that the apparatus loop 42 is only enabled when a disc is actually in focus.

Assuming that DIF = 1, then step 132 will be executed in which the monitor reference level MREF is set to correspond to the maximum output level $O_{Lmax}$ of the laser L, for example 5 mW. The apparatus loop reference level SREF on the other hand is set to a value representing a nominal value of SOUT, corresponding to the optical output level of the optical system 2 which gives the best information signal from the disc. With the reference levels set, the signal ENS = 1 is generated to make the connection 123 and enable the apparatus loop 42.

The apparatus loop error signal SERR then operates to vary the optical output of the laser L in order to compensate for variations within the optical system 2. As a further advantage, these variations include not only the transmission tolerances of the optical pick-up which were compensated by the known method, but also variations in the reflectivity of discs loaded into the player. The limiting circuit 122, by preventing positive values of SERR reaching the summing circuit 56, prevents the maximum safe laser output defined by the monitor reference level MREF being exceeded. This is necessary since the apparatus loop 42 would otherwise tend to send the laser output to infinity if the optical path were interrupted, for example by a "black drop-out" on the disc.

If the apparatus loop 42 is not to be enabled (DIF = 0 in step 130), then step 134 is executed which generates a signal ENS = 0 to disable the apparatus loop and sets MREF to a nominal level, corresponding for example to $O_L = 3$ mW, to allow safe operation, for example until the pick-up is focussed on a disc.

It should be noted that the provision of the apparatus feedback loop 42 reduces the accuracy required in the monitor sensitivity determination, provided that it can be ensured that the maximum laser output $O_{Lmax}$ is not exceeded. Furthermore, if the bandwidth of the apparatus loop 42 is made as high as say 250 Hz (for a standard CD-player), transient reflectivity variations such as are caused by fingerprints and other blemishes on the disc surface will be compensated for by an increase or decrease in the laser output power at the appropriate time, subject of course to the maximum level $O_{Lmax}$.

The control system shown in FIG. 4 can be constructed in any convenient manner. For example the controller 44 and the digital components of the feedback loops 40 and 42 can be implemented in a dedicated signal processing chip, or by an appropriately programmed general purpose chip such as Philips' SP5010 digital signal processor. If, on the other hand, the loops 40 and 42 were implemented chiefly using analogue circuits the controller 44 might for example comprise a suitably programmed microcontroller chip such as Philips' MAB8051.

As mentioned above, the differential efficiency is generally better defined than the monitor sensitivity of a radiation emitting arrangement such as the LT022MS. It has further been mentioned that the apparatus feedback loop 42 has some capacity to compensate for inaccuracies in the monitor sensitivity signal SENS, and hence to compensate for uncertainty in the value DEFF representing the assumed differential efficiency. However, if the variation in differential efficiency is too great to be compensated in this way, it should be remembered that the differential efficiency of low-cost laser/photodiode arrangements such as the LT022MS is relatively constant over large batches of arrangements. Therefore either the batches can be selected which fall within an acceptable range of differential efficiency, or means can be provided for setting the value DEFF in a corresponding batch of control systems at the factory. This might be done for example by means of DIP-switches or by cutting certain tracks on a printed circuit board. Although such an operation must be performed on each player, the value for DEFF can be determined by measuring only a representative sample of a batch of radiation emitting arrangements, so that use of the invention still eliminates the need for a testing rig, a reference disc and a risky manual adjustment of a potentiometer on every apparatus.

It should be appreciated that the invention has application not just to semiconductor laser and photodiode arrangements such as the LT022MS, but also to any radiation emitting arrangements having ill-defined monitor sensitivities but relatively well-defined differential efficiencies. Furthermore, the invention may apply equally to semiconductor lasers which form only part of a more complex laser element, perhaps including frequency doublers and so forth. Moreover, such arrangements are of use in a wide range of apparatuses in addition to optical disc players, for example in optical fiber communications, in displays, laser printers and so on.

From reading the present disclosure, other variations will be apparent to persons skilled in the art. Such variations may involve other features which are already known in the design, manufacture and use of optical systems, control systems for radiation emitting arrangements and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A method of determining the monitoring sensitivity of a radiation source which is monitored by a radiation detector, the radiation detector producing a monitor signal which is related to the optical output of the radiation source, the monitoring sensitivity being the rate of change of the monitor signal level relative to the optical output level of the radiation source; said method comprising the steps of:
   (i) supplying a varying drive signal to the radiation source and measuring the rate of change of the monitor signal relative to the supplied drive signal; and
   (ii) determining the monitoring sensitivity by combining the measured rate of change of the monitor signal with a predetermined differential efficiency which is indicative of the rate of change of the optical output of the radiation source relative to the drive signal supplied thereto.

2. A method according to claim 1 wherein the step (i) comprises:
   supplying a drive signal to the radiation source at a first drive level which causes the monitor signal to be at a first reference level, and measuring the said first drive level;
   changing the drive signal to a second drive level which causes the monitor signal to be at a second reference level, and measuring the said second drive level; and
   dividing the difference between the first and second monitor reference levels by the difference between the first and second drive levels so as to determine the rate of change of the monitor signal relative to the drive signal.

3. A method according to claim 2 wherein the first and second reference levels of the monitor signal are selected with respect to a predetermined monitoring sensitivity so as to minimize the possibility of the optical output of the radiation source exceeding a predetermined maximum level during performance of the method.

4. A method as claimed in any one of claims 1 to 3, further comprising supplying a drive signal to the radiation source at a drive level which causes the monitor signal to be at a level which corresponds to a desired optical output level of the radiation source.

5. A method according to claim 4 further comprising modifying the monitor signal level, and hence the desired optical output level of the radiation source, in response to an output signal from an optical system which receives the optical output of the radiation source.

6. A method according to claim 5 wherein said modification of the monitor signal level is limited so as to prevent the optical output of the radiation source from exceeding a predetermined maximum level.

7. A method according to claim 5 wherein said radiation source and said optical system are included in an optical recording and/or reproducing apparatus, and the output signal of the optical system is an information signal derived from an information carrier which is illuminated by the optical output of the radiation source.

8. A system for controlling the optical output of a radiation source, the system comprising:
   a radiation detector for monitoring the optical output of the radiation source and producing a monitor signal corresponding thereto, the monitor signal level being related to the optical output level by a monitoring sensitivity;
   means for supplying a drive signal to the radiation source at a drive level which causes the monitor signal to be at a reference level which corresponds to a desired optical output level of the radiation source;
   means for measuring the rate of change of the monitor signal with respect to the drive signal; and
   means for determining said monitoring sensitivity by combining the measured rate of change of the monitor signal with a predetermined differential efficiency which is indicative of the rate of change of the optical output of the radiation source with respect to the supplied drive signal.

9. A control system according to claim 8, further comprising means for modifying the monitor signal reference level, and hence the desired optical output level of the radiation source, in response to an output signal from an optical system which receives the optical output of the radiation source.

10. A control system according to claim 9, further comprising means for limiting the modification of the monitor signal reference level so as to prevent the optical output of the radiation source from exceeding a predetermined maximum level.

11. A control system according to claim 9 wherein said radiation source and said optical system are included in an optical recording and/or reproducing apparatus, and the output signal of the optical system is an information signal derived from an information carrier which is illuminated by the optical output of the radiation source.

12. A control system according to claim 8 wherein the rate of change measuring means comprises:
   means for supplying a drive signal to the radiation source at a first drive level which causes the monitor signal to be at a first reference level;
   means for supplying a drive signal to the radiation source at a second drive level which causes the monitor signal to be at a second reference level;
   means for measuring said first and second drive levels; and
   means for determining the rate of change of the monitor signal relative to the drive signal by dividing the difference between the first and second monitor reference levels by the difference between the first and second drive levels.

13. A control system according to claim 12 wherein the first and second reference levels of the monitor signal are selected with respect to a predetermined value of said monitoring sensitivity so as to minimize the possibility of the optical output of the radiation source exceeding a predetermined maximum level during determination of the rate of change of the monitor signal.

14. A control system according to claim 8, further comprising a digital control circuit having an output for setting the reference level of the monitor signal and having an input for receiving information signifying the level of the drive signal supplied to the radiation source.

15. An optical recording and/or reproducing apparatus comprising a radiation source and a control system for supplying a drive signal to the radiation source so as to stabilize the optical output thereof at a desired level, the control system comprising:
   a radiation detector adapted to produce a monitor signal which is related to the optical output of the radiation source by a monitoring sensitivity;
   drive means for supplying a drive signal to the radiation source at a level which causes the monitor signal to be at a reference level corresponding to a desired level of the optical output of the radiation source;
   means for measuring the rate of change of the monitor signal with respect to the drive signal; and
   means for determining said monitoring sensitivity by combining the measured rate of change of the monitor signal with a predetermined differential efficiency which is indicative of the rate of change of the optical output of the radiation source relative to the supplied drive signal.

16. Apparatus according to claim 15, wherein the control system further comprises means for modifying the reference level of the monitor signal, thereby also modifying the desired optical output level of the radiation source, in response to a signal produced by an optical system which receives the optical output of the radiation source.

17. Apparatus according to claim 15, wherein the control system further comprises means for limiting the modification of the monitor signal reference level so as to prevent the optical output of the radiation source from exceeding a predetermined maximum level.

* * * * *